United States Patent [19]

Seo

[11] Patent Number: 4,829,480
[45] Date of Patent: May 9, 1989

[54] COLUMN REDUNDANCY CIRCUIT FOR CMOS DYNAMIC RANDOM ACCESS MEMORY

[75] Inventor: Seung-Mo Seo, Seoul, Rep. of Korea

[73] Assignee: Samsung Electronics Co., Ltd., Suwon, Rep. of Korea

[21] Appl. No.: 88,151

[22] Filed: Aug. 21, 1987

[30] Foreign Application Priority Data

Aug. 22, 1986 [KR] Rep. of Korea ............... 86-6932

[51] Int. Cl.$^4$ .............................................. G11C 7/00
[52] U.S. Cl. ........................................ 365/200; 371/10
[58] Field of Search .................... 365/200, 210, 230; 371/10

[56] References Cited

U.S. PATENT DOCUMENTS

| 4,228,528 | 2/1979 | Cenker et al. | 365/200 |
| 4,389,715 | 6/1983 | Eaton, Jr. et al. | 365/200 |
| 4,556,975 | 12/1985 | Smith et al. | 371/10 |
| 4,734,889 | 3/1988 | Mashiko et al. | 365/200 |

*Primary Examiner*—Joseph A. Popek
*Attorney, Agent, or Firm*—Robert E. Bushnell

[57] ABSTRACT

A dynamic random access memory for substituting a normal column line under the control of the output of cells for a spare column line coupled to defect-free spare memory cells with a latch having a master fuse and an input terminal coupled to a reset clock, a spare column decoder enabling or disabling the spare column line with the output of the latch and the selective input of either true column address signals or complement column address signals and a plurality of normal column decoders enabling or disenabling normal column lines with the column address signals addressing a specified normal column line under the control of the ouptut of the spare column decoder.

29 Claims, 5 Drawing Sheets

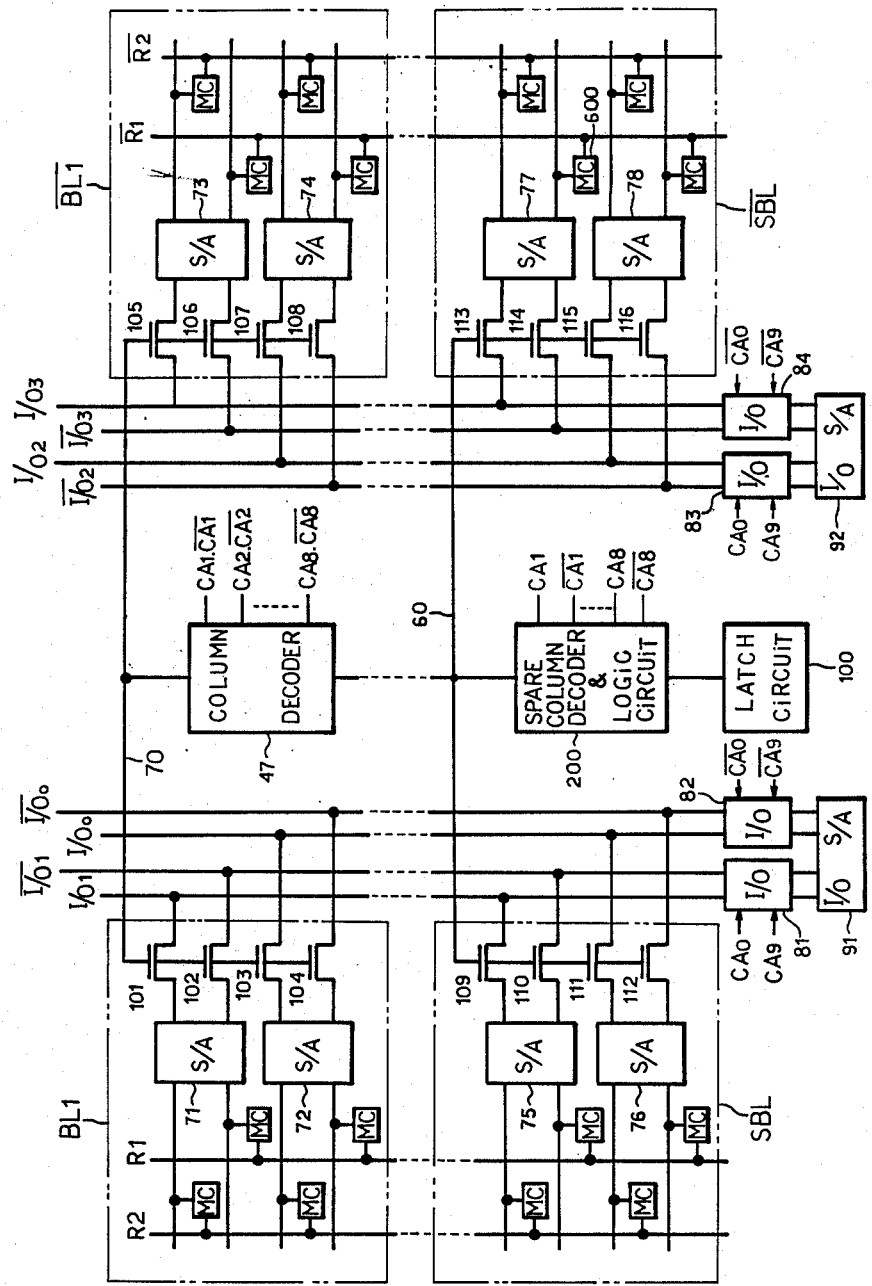
F I G. 4

COLUMN REDUNDANCY CIRCUIT FOR CMOS DYNAMIC RANDOM ACCESS MEMORY

BACKGROUND OF THE INVENTION

1. Field of the Invention

The present invention relates to semiconductor integrated circuit memories, and more particularly, to a circuit for providing redundant columns in such memories when other portions of the memory are found defective.

2. Description of the Prior Art

In integrated circuit memories, a single defect in any portion of the array of memory cells may render the entire memory useless. Furthermore, as improvements in the design and fabrication of integrated circuits are made, greater numbers of memory cells are being placed on a single chip and as a result, very large scale integrated circuits are made. In such case, the probability of producing one or more defective memory cells will be easily increased and the entire memory will be rendered useless.

As prior art to solve such a problem, integrated circuit memories have been designed and fabricated in such a manner that spare memory cells in addition to normal memory cells are arranged on the same chip in order to substitute defect-free spare memory cells for defective normal memory cells. To achieve such substitution, integrated circuit memories need decoder circuits: normal decoders which may be used to disable address signals selecting a row or a column associated with defective memory cells and spare decoders which may address a row or a column associated with defect-free spare memory cells with said address signals.

After the fabrication of the integrated circuit memory, it would be tested to determine whether memory cells had been defective, or not. If rows or columns including normal memory cells are determined to be defective, integrated circuit memories will be programmed in such a manner that a spare decoder including defect-free spare memory cells may be enabled by address signals selecting the defective normal memory cells and then, a normal decoder selecting a row or a column corresponding to defective normal memory cells may be disabled by said address signals.

There are two ways of programming in that manner: one way by using nonvolatile memory elements and the other way by blowing polysilicon fuses. Again, the way of blowing the fuses can be divided into the use of laser spots and that of electrical current.

Currently, according to the development of the semiconductor device manufacturing process, there has been a redundancy scheme in which blocks including defective normal memory cells may be replaced with spare blocks including defect-free spare memory cells. For example, assuming that 64K normal memory cells are divided into 4 blocks of 16K memory cells, fault of one cell of 16K memory cells constituting each block requires the replacement of the defective block with a defect-free 16-K spare memory cell block.

In a dynamic random access memory, the row redundancy of substituting the faulty normal row line for the defect-free spare row line can be easily accomplished without more difficulty. However, the column redundancy raises some problems. When the spare decoder disclosed in the U.S. Pat. No. 4,228,528 is used in a semiconductor dynamic random access memory device, such device needs to include circuits for detecting the column address transition in a static column mode operation. As a result, such on-chip addition of column address transition detection circuits incurs the drawback of increased chip size.

For example, FIG. 1 and FIG. 2 are circuit diagrams illustrative of the normal decoder and spare decoder respectively as prior art circuit diagrams performing the column redundancy with laser fusing.

A column line (or bit line) of the normal memory cell array is connected to a line 8 of FIG. 1. A column line of the spare memory cell array is connected to a line 18 of FIG. 2.

Therefore, in case of substituting the column line of the normal memory cell array, the operation of the column normal decoder will be disabled with the blowing of fuse 7, while fuses 15 and 16 of the column spare decoder of FIG. 2 are programmed by fusing so that the spare decoder may be enabled with the input of column address signals to the normal decoder. On the other hand, the use of the normal decoder means blowing of fuse 17 in the spare decoder.

FIG. 3 is a wave form diagram illustrative of selecting a spare column line in connection with the use of the spare decoder of FIG. 2.

In DRAM devices, when $\overline{RAS}$ (Row address strobe) is rendered to a logic low state (ground level), row address signals are transmitted. In the low state of $\overline{RAS}$, when $\overline{CAS}$ is rendered low in the static column mode, column address signals are transmitted to the column spare decoder. In this case, whenever the transition of column address signals arises, such detected transition clock is a reset clock RST shown in FIG. 2. The reset clock RST is coupled to a gate of N channel MOS transistor 12 of FIG. 2.

To produce such a clock, the column address transition detection circuit is inevitably required to be arranged on the same chip. This necessitates increased chip size.

Another problem is of the power consumption because, whenever the reset clock RST is applied to the gate of the transistor 12, the transistor 12 and at least one of transistors 10A (or 10B) through 11A (or 11B) conduct.

SUMMARY OF THE INVENTION

Accordingly, it is an object of the present invention to provide a CMOS integrated circuit for simply performing column redundancy.

It is another object of the present invention to provide a CMOS integrated circuit for simply performing the column redundancy in a static column mode.

It is another object of the present invention to provide a CMOS integrated circuit for performing the column redundancy by block replacement.

It is still another object of the present invention to provide a CMOS redundancy circuit characterized by decreased power consumption and chip size.

These and other objects are achieved with a dynamic random access memory for substituting a normal column line coupled to faulty normal memory cells for a spare column line coupled to defect-free spare memory cells with a latch having a master fuse and an input terminal coupled to a reset clock, a spare column decoder enabling or disenabling the spare column line with the output of the latch and selective input of either true column address signals or complement column address signals and a plurality of normal column decoders enabling or disenabling normal column lines with the column address signals addressing a specified normal column line under the control of the output of the spare column decoder.

BRIEF DESCRIPTION OF THE DRAWINGS

FIG. 4 is a circuit diagram illustrative of performing a block column redundancy in a semiconductor dynamic RAM according to the present invention;

DETAILED DESCRIPTION OF THE INVENTION

Figure 1:
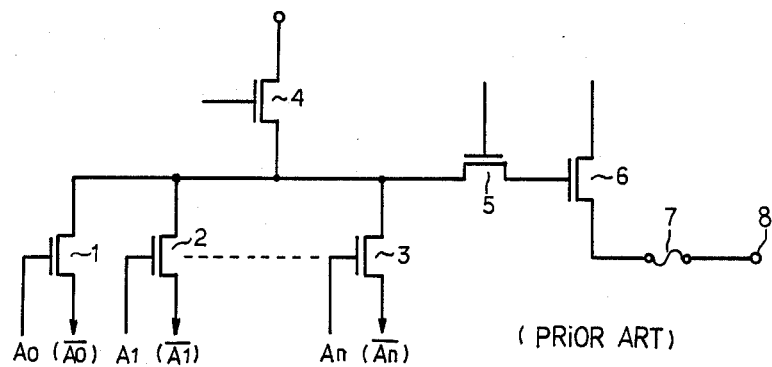
FIG. 1 is a circuit diagram illustrative of a conventional normal decoder.
Figure 2:
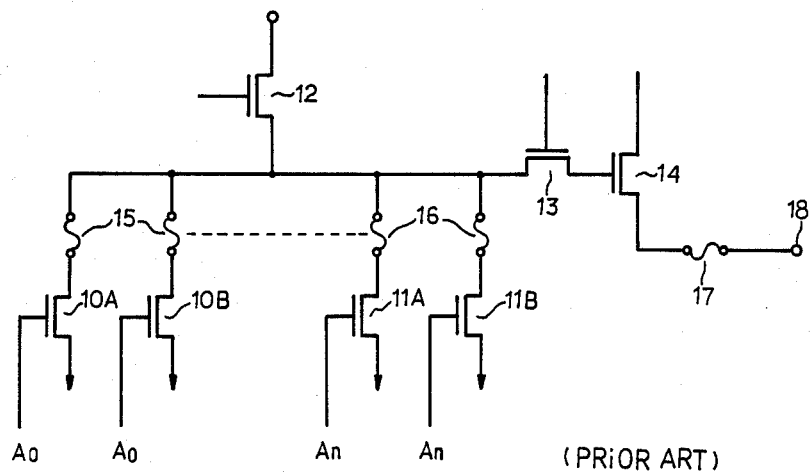
FIG. 2 is a circuit diagram illustrative of a conventional spare decoder.
Figure 3:
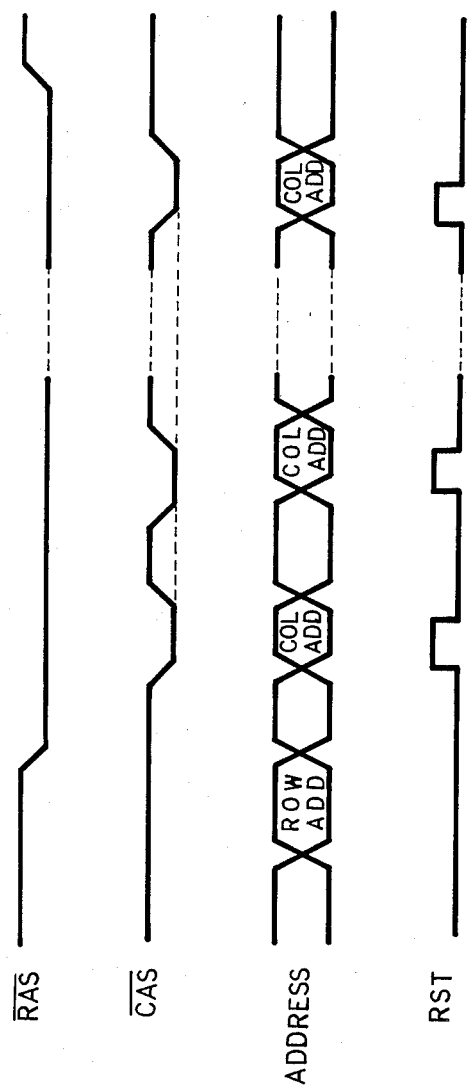
FIG. 3 is a timing diagram of a reset clock in a static column mode operation.

FIG. 4 illustrates a circuit diagram for performing a block column redundancy in a semiconductor DRAM device according to the present invention.

Referring to FIG. 4, R1 and R2 represent row(or word) lines, MC a memory cell, reference numerals 71 through 78 sense amplifiers, reference numerals 81 through 84 input/output switching circuits, reference numerals 91 and 92 input/output sense amplifiers, reference numeral 100 a latch circuit, reference numeral 200 a spare column decoder and logic circuit, and reference numeral 47 a normal column decoder which is coupled to the output terminal of the spare column decoder 200 and inputs column address signals CA1 (or $\overline{CA1}$) through CAn-1 (or $\overline{CAn-1}$). Memory cells MC are associated with each of sense amplifiers 71 through 78 in known folded bit line type. The sense amplifier 71 in a normal block BL1 is connected to the respective input-/output bus lines I/O 1 and $\overline{I/O\ 1}$ via a pair of transmission transistors 101 and 102. The other sense amplifier 72 in the block BL1 is connected to the respective input-/output bus lines I/O 0 and $\overline{I/O\ 0}$ via a pair of transmission transistors 103, 104, while sense amplifiers 73 through 78 in blocks BL1, SBL and SBL are connected to respective input/output bus lines I/O 0 and I/O 0, I/O 1 and I/O 1, I/O 2 and I/O 2, through I/O 3 and I/O 3 via transmission transistors 105 through 116 as shown in FIG. 4. Input/output bus line pairs I/O 0 and $\overline{I/O\ 0}$ through I/O 3 and $\overline{I/O\ 3}$ are connected to the respective input/output switching circuits 81 through 84. Output lines of the input/output switching circuits 81 and 82 and those of the input/output switching circuit 83 and 84 are coupled to input/output sense amplifiers 91 and 92 respectively.

The output terminal of the latch circuit 100 is coupled to the spare column decoder 200. The output terminal of spare column decoder 200 is coupled to a spare column line 60 connected to the spare block SBL and $\overline{SBL}$ and also is coupled to the normal decoder 47 connected to normal block BL1 and $\overline{BL1}$ and normal decoders connected to other abbreviated normal blocks, respectively. Each of normal blocks BL1, $\overline{BL1}$, ... comprises a pair of sense amplifiers and two pairs of transmission transistors, as also do each of spare blocks SBL and $\overline{SBL}$.

Now, let us assume that there are normal memory cells of 256 bits in the normal blocks of FIG. 4, an eight bit row address and a ten bit column address CA0 and CA9 are needed.

One of the column address CA0 and CA9 and one of its complements $\overline{CA0}$ and $\overline{CA9}$ are supplied to input-/output switching circuits 81 through 84 respectively and they are used as switching control signals for transferring data signals between input/output pairs I/O 0 and $\overline{I/O\ 0}$ through I/O 3 and $\overline{I/O\ 3}$ and input/output sense amplifiers 91 and 92 respectively. Therefore, there are $512(=2^8\times 2)$ normal blocks with the array split into two halves, that is, the left half and the right half, of 256 blocks each. There are $512(=2^8\times 2)$ memory cells in the respective normal block. There are respectively spare blocks SBL and $\overline{SBL}$ on each lower portion of the left and right halves.

256 normal column decoders connected to the respective normal column lines 70 for simultaneously selecting normal blocks of two halves and one spare column decoder 200 connected to the spare column line 60 for selecting spare blocks SBL and $\overline{SBL}$ are arranged at the center of the memory array. The latch circuit 100 functions to latch low or high due to the input of clock RST as will be mentioned below when RAS is at a low level state in a static column mode operation.

Now, if one or more memory cells of one of the normal blocks, that is, the normal blocks BL1, have failed, normal blocks BL1 and $\overline{BL1}$ will be replaced with spare blocks SBL and $\overline{SBL}$ including defect-free memory cells with a low state output of the normal column decoder 47 and a high state output of the spare column decoder 200.

Figure 5:
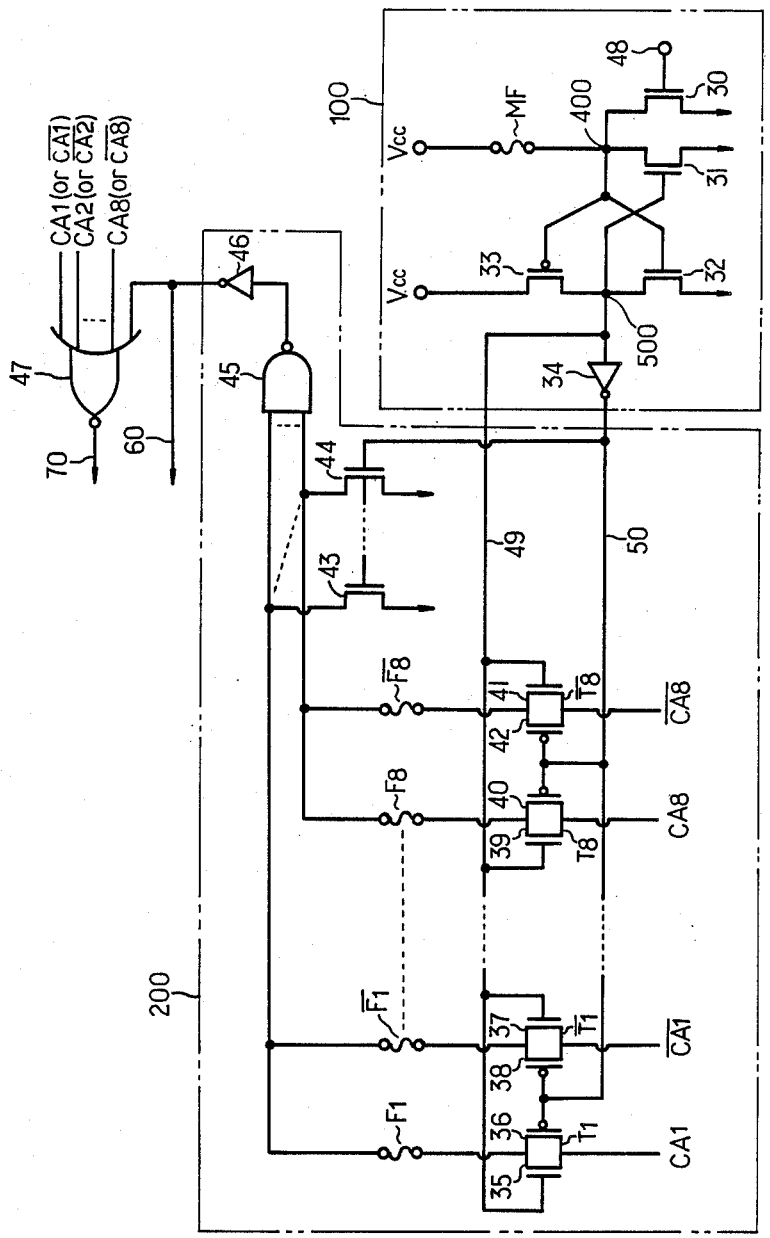
FIG. 5 is a detailed circuit diagram of a latch circuit, a spare column decoder and logic circuit and a normal column decoder used as parts of FIG. 4 according to the present invention.

FIG. 5 represents a detailed circuit diagram of the normal column decoder 47, the spare column decoder 200 and the latch circuit 100 of FIG. 4 as the column redundant circuit according to the present invention.

Referring to FIG. 5, the latch circuit 100 is composed of a pair of driver N-channel MOS transistors 31 and 32 whose each gate is connected to the drain 400 or 500 of the other and both of whose sources are connected to the ground source, a N-channel MOS transistor 30 whose drain-source current path is connected between the drain 400 and the ground source, masterfuse MF connected between Vcc supply voltage source and the drain 400, a p-channel MOS transistor 33 whose source-drain current path is connected between the Vcc supply voltage source and the drain 500 and whose gate is connected to the drain 400, and an inverter 34 connected to the drain 500. A gate terminal 48 of the N-channel MOS transistor 30 is coupled to the clock RST as will be mentioned hereinafter.

The spare column decoder and logic circuit 200 is composed of transmission gates $\overline{T1}$ to $\overline{T8}$ for transferring the column address $\overline{CA1}$ through $\overline{CA8}$ respectively, transmission gates T1 to T8 for transferring the column address CA1 through CA8 respectively, fuses $\overline{F1}$ to $\overline{F8}$ respectively connected to the output of transmission gates $\overline{T1}$ through $\overline{T8}$ fuses F1 to F8 respectively connected to output lines, of transmission gates T1 through T8, a NAND gate 45 whose input terminals are connected to connection nodes of fuse pairs F1 and $\overline{F1}$ to F8 and $\overline{F8}$ each, N-channel MOS transistors 43 to 44 whose drains are respectively connected to input terminals of the NAND gate 45 and whose sources are connected to the ground source, and an inverter 46 whose input is connected to the output line of the NAND gate 45. Transmission gate pairs T1 and $\overline{T1}$ to T8 and $\overline{T8}$ are each composed of N-channel and P-channel MOS transistor pairs 35 and 36 to 41 and 42 as shown in FIG. 5. Gates of P-channel MOS transistors are connected to a line 50, and gates of N-channel MOS transistors are connected to a line 49. The lines 49 and 50 are connected to the input terminal and the output terminal of the inverter 34 respectively.

The output terminal of the inverter 46 is connected to the spare column line 60 and to the input terminal of the normal column decoder 47 formed of known NOR gate. It should be noted that the output terminal of the inverter 46 may be respectively connected to input terminals of remaining normal column decoders. The normal column decoder 47 receives the column address signals CA1 (or $\overline{CA1}$) to CA8 (or $\overline{CA8}$) and the output signal of the inverter 46, and the output terminal thereof is connected to the normal column line 70, being coupled to gates of transmission transistors 101 to 108.

Figure 6:
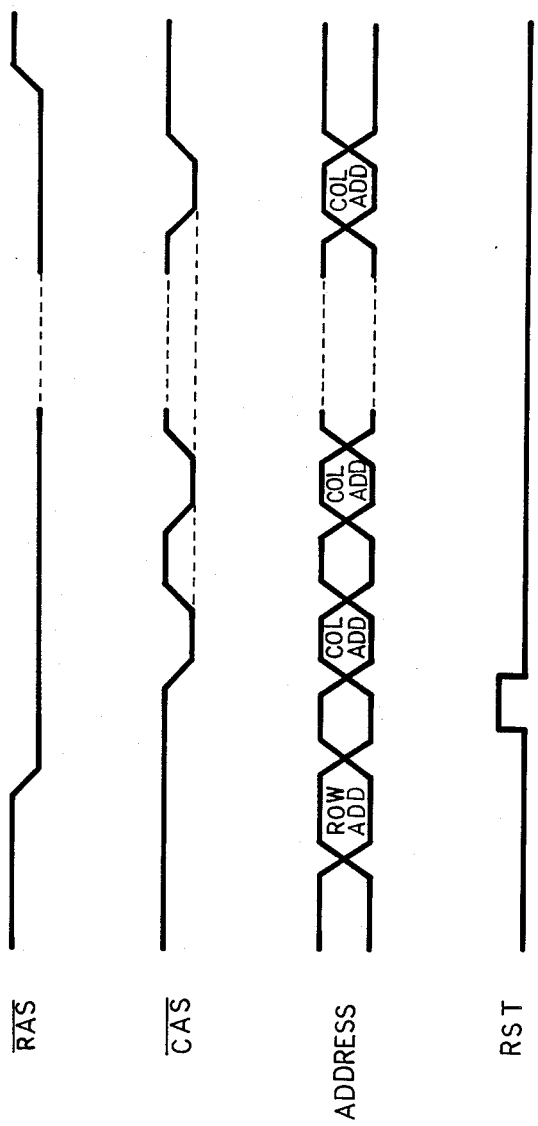
FIG. 6 is a timing diagram of a reset clock used in the present invention.

FIG. 6 represents a timing diagram of a reset clock RST applied to the input terminal 48 of FIG. 5 in a static column mode operation.

Referring FIG. 6, the reset clock RST has a pulse of high state after $\overline{RAS}$ goes low but before column address signals COL ADD are received into the column decoders.

Hereinbelow, the operation of FIG. 5 according to the present invention will be described in detail.

In the case where the spare blocks $\overline{SBL}$ and SBL are not selected, all fuses are not blown. Even if the reset pulse RST of FIG. 6 is applied to the terminal 48, the potential of node 400 is always kept at a high state. Therefore, the P-channel MOS transistor 33 remains at an OFF state and also the N-channel MOS transistor 32 keeps an ON state, thereby the node 500 is latched in a low state and the output line 50 of the inverter 34 maintains a high state. Then, transmission gates T1 and T8 and $\overline{T1}$ to $\overline{T8}$ become OFF.

However, N-channel MOS transistors 43 to 44 are all turned on, thereby the output of the NAND gate 45 is at a high state and the output of the inverter 46 is at a low state. Therefore, the spare column line 60 becomes low and transmission transistors 109 to 116 become OFF so that spare memory cells of spare blocks SBL and $\overline{SBL}$ are not selected.

The output of the inverter 46 is applied to the normal column decoder 47 formed by a NOR gate along with column address signals CA1 (or $\overline{CA1}$) to CA8 (or $\overline{CA8}$). When the normal column line 70 is selected by the input signals of the normal column decoder 47, the line 70 becomes high and then transmission transistors 101 to 108 of FIG. 4 are all turned on. Therefore, one normal memory cell of normal blocks BL1 and $\overline{BL1}$ may be selected by row selection signal on a row line R1 (or $\overline{R1}$) or R2 (or $\overline{R2}$).

Now, the case where the column redundancy is performed due to one or more defective normal memory cells will be described in detail.

Now, let us assume that one or more memory cells of normal block BL1 or/and $\overline{BL1}$ are defective and column address signals $\overline{CA1}$ to $\overline{CA2}$ are all low (the complement signals CA1 to CA2 are all high).

At this time, fuses F1 to F8 corresponding to the lines for transferring the column address signal of a low state and the master fuses MF are all blown by laser spots. Therefore, the node 400 is a floating state and the node 500 is an unknown state. As the reset clock RST while in a high state pulse, after RAS is low, is applied to the terminal 48, the node 400 becomes low due to the conduction of N-channel MOS transistor 30 and then the P-channel MOS transistor 33 is rendered conductive, while the N-channel MOS transistor 32 becomes OFF. Therefore, the node 500 is latched a high state and the output line 50 of the inverter 34 a low state. By the high state of the line 49 and the low state of the line 50, transmission gates T1 to T8 are all rendered conductive and N-channel transistors 43 to 44 become OFF.

Therefore, complement column address signals $\overline{CA1}$ to $\overline{CA8}$ which are all high states are applied to the NAND gate 45 via transmission gates $\overline{T1}$ to $\overline{T8}$ and unblown fuses $\overline{F1}$ to $\overline{F8}$. As a result, the output of the inverter 46 becomes high.

Therefore, transmission transistors 109 to 116 connected to the spare column line 60 become conductive, thereby spare blocks SBL and $\overline{SBL}$ are selected. On the other hand, by the high state of the output of the inverter 46, outputs of all normal decoders become low and all tramsmission transistors in the respective normal blocks become nonconductive. Therefore, in a read operation, if column address signals CA0 and CA9 are all low states and a row (or word) line $\overline{R1}$ is selected, a data signal stored in a memory cell 600 of the spare block $\overline{SBL}$ is delivered to the input/output sense amplifier 92 via the sense amplifier 77, the transmission transistor 114, the input/output bus line $\overline{I/O}$ 3 and the input/output switching circuit 84.

As mentioned above, although the present invention has been described for the column redundancy scheme a 256K dynamic RAM, it should be noted that for those skilled in the art it might be easily be applied to an 1 mega-bit dynamic RAM by the use of four 256K dynamic RAMs of FIG. 4.

Therefore, the present invention may achieve a reduced chip size because the above mentioned address transition detection circuits are not needed, and accomplished low power consumption due to the use of the latch circuit and transmission gates.

I claim:
1. A dynamic random access memory, comprising:
   a plurality of normal blocks, each normal block including normal memory cells arranged in rows and columns, normal transmission transistors, and normal sense amplifiers connected to different pairs of said normal memory cells and normal transmission transistors, each transmission transistor having a source, a drain and a gate, one of said source and drain of each said normal transmission transistor being connected to said normal sense amplifiers;
   a spare block including spare memory cells having the same number of cells as said normal memory cells, arranged in rows and columns, spare transmission transistors, and spare sense amplifiers connected to different pairs of said spare memory cells and spare transmission transistors, each spare transmission transistor having a source, a drain and a gate, one of said source and drain of each of said spare transmission transistor being connected to said spare sense amplifiers;
   inout/output means for transmitting information, said input/output means connected to the other of said source and drain of each said normal and spare transmission transistor;
   a plurality of normal column lines, each normal column line being connected to gates of said normal transmission transistors of each normal block;
   a spare column line connected to gates of said spare transmission transistors of said spare block;

latch means including a master fuse connectable to receive a supply voltage, and a second input terminal connectable to a reset clock providing a pulse after the input of a row address strobe but before the input of column address signals, for providing a first logic signal in response to the input of said supply voltage without blowing said master fuse when said normal blocks are determined to be defect-free and a second logic signal in response to said pulse after said master fuse has been blown when one of said normal blocks is determined to be defective;

spare column decoding means connected to said latch means and said spare column line, for providing a spare block disabling signal with the input of said first logic signal and a spare block enabling signal with said second logic signal and the input of true and complement column address signals; and normal column decoding means connected to said normal column lines and said spare column decoding means, for addressing a specified normal block with the input of column address signals under the control of said spare block disabling signal and disabling said normal column decoding means so as to not select said normal blocks with the input of said spare block enabling signal.

2. A dynamic random access memory according to claim 1, wherein said latch means comprises a clamping node connected to said master fuse, an output node, a ground source node, a first transistor whose channel path is connected between said clamping node and said ground source node and whose gate is connected to said second input terminal, a first inverter connected between said clamping node and said output node, and a second transistor whose channel path is connected between said clamping node and said ground source node and whose gate is connected to said output terminal.

3. A dynamic random access memory according to claim 2, wherein said first and second transistors are N-channel MOS transistors and said first inverter is a CMOS inverter.

4. A dynamic random access memory according to claim 2, wherein said spare column decoding means comprises:

a plurality of true and complement column address input terminals conducting true and complement column address signals of each column address signal;

a plurality of true and complement transmitting paths connected to said true and complement column address input terminals respectively;

a plurality of transmission means each associated in series on different ones of said transmitting paths respectively, for transmitting true and/or complement column address signals in response to said second logic signal of said latch means;

a plurality of fuses each associated in series on different ones of said transmitting paths respectively, said fuses being not blown when there is no defective normal block but being blown so as to transmit selected signals of either said true column address signals or said complement column address signals when there are defective normal blocks;

a plurality of connecting nodes commonly connected at end terminals of said true and complement transmitting paths of each column address signal;

a plurality of transistors whose channel paths are connected in parallel between said connecting nodes and said ground source node and whose gates are coupled to complements of said output logic signal of said latch means; and a logic gate connected to said connecting nodes.

5. A dynamic random access memory according to claim 4, wherein said transmission means comprises a pair of P-channel MOS and N-channel MOS transistors whose channel paths are connected in parallel, a gate of said P-channel MOS transistor coupled to a complement of said output logic signal of said latch means and a gate of said N-channel MOS transistor coupled to said output logic signals of said latch means.

6. A dynamic random access memory according to claim 5, wherein normal and spare memory cells are arranged in a folded bit line configuration.

7. A dynamic random access memory according to claim 5, wherein said master fuse and said fuses are made of polycrystalline silicon.

8. A dynamic random access memory according to claim 5, wherein said logic gate is a NAND gate and each of said transmitting paths is programmed to transmit the true column address signal.

9. A dynamic random access memory according to claim 2, wherein said first and second transistors are N-channel MOS transistors and said first inverter is a CMOS inverter.

10. A dynamic random access memory according to claim 1, wherein said space column decoding means comprises:

a plurality of true and complement column address input terminals conducting true and complement column address signals of each column address signal;

a plurality of true and complement transmitting paths connected to said true and complement column address input terminals respectively;

a plurality of transmission means each associated in series on different ones of said transmitting paths respectively, for transmitting true and/or complement column address signals in response to said second logic signal of said latch means;

a plurality of secondary fuses each associated in series on different ones of said transmitting paths respectively;

a plurality of connecting nodes commonly connected at end terminals of said true and complement transmitting paths;

a plurality of transistors having channel paths connected in parallel between said connecting nodes and said ground source node and having gate electrodes coupled to complements of said output logic signal of said latch means, and a logic gate connected to said connecting nodes.

11. A dynamic random access memory according to claim 10, wherein said transmission means comprises a pair of P-channel MOS and N-channel MOS transistors having channel paths connected in parallel, a gate electrode of said P-channel MOS transistor coupled to receive a complement of said output logic signals of said latch means and a gate electrode of said N-channel MOS transistor coupled to receive said output logic signals of said latch means.

12. A dynamic random access memory according to claim 11, wherein said normal and spare memory cells are arranged in a folded bit line configuration.

13. A dynamic random access memory according to claim 11, wherein said master fuse and said secondary fuses are made of polycrystalline silicon.

14. A dynamic random access memory according to claim 11, wherein said logic gate is a NAND gate and each of said transmitting paths arranged to transmit true column address signals.

15. A semiconductor memory comprising:
a plurality of normal blocks of memory cells, said memory cells being arranged in rows and columns;
a spare block of memory cells having the same number of cells as said normal blocks arranged in rows and columns;
a plurality of normal column lines, each normal column line being connected to a different one of said normal blocks;
a spare column line connected to said spare block;
latch means including a fuse connectable to receive a supply voltage and a second input terminal connectable to a clock providing a pulse after the input of a row address strobe but before the input of column address signals, for providing a first logic signal in response to the input of said supply voltage via said fuse and a second logic signal in response to said pulse after said fuse has been blown;
spare column decoding means connected to said latch means and said spare column line, for providing a spare block disabling signal with the input of said first logic signal, and for providing a spare block enabling signal with said second logic signal and the output of true and complement column address signals, and
normal column decoding means connected to said normal column lines and said spare column decoding means, for accessing a normal block via a corresponding one of said normal column lines with the input of column address signas under the control of said spare block disabling signal, and preventing accessing of one of said normal blocks with input of said spare block enabling signal.

16. A semiconductor memory according to claim 15, wherein said latch means comprises a clamping node connected to said fuse, an output node, a ground source node, a first transistor having a channel path connected between said clamping node and said ground source node and having a gate electrode connected to said second input terminal, a first inverter connected between said clamping node and said output node, and a second transistor having a channel path connected between said clamping node and said ground source node and having a gate connected to said output terminal.

17. A semiconductor memory according to claim 16, wherein said first and second transistors are N-channel MOS transistors and said first inverter is a CMOS inverter.

18. A semiconductor memory according to claim 16, wherein said spare column decoding means comprises:
a plurality of true and complement column address input terminals conducting true and complement column address signals of each column address signal;
a plurality of true and complement transmitting paths connected to said true and complement column address input terminals respectively;
a plurality of transmission means each associated in series on different ones of said transmitting paths respectively, for transmitting true and/or complement column address signals in response to said second logic signal of said latch means;
a plurality of second fuses each associated in series on different ones of said transmitting paths respectively;
a plurality of connecting nodes commonly connected at end terminals of said true and complement transmitting paths;
a plurality of transistors having channel paths connected in parallel between said connecting nodes and said ground source node and having gate electrodes coupled to receive complements of said output logic signals of said latch means; and
a logic gate connected to said connecting nodes.

19. A semiconductor memory according to claim 18, wherein said transmission means comprises a pair of P-channel MOS and N-channel MOS transistors having channel paths connected in parallel, a gate electrode of said P-channel MOS transistor coupled to receive complements of said output logic signals of said latch means and a gate electrode of said N-channel MOS transistor coupled to receive said output logic signals of said latch means.

20. A semiconductor memory according to claim 19, wherein said normal and spare memory cells are arranged in a folded bit line configuration.

21. A semiconductor memory according to claim 19, wherein said logic gate is a NAND gate and each of said transmitting paths are arranged to transmit true column address signals.

22. A semiconductor memory comprising:
a plurality of normal block of memory cells arranged in rows and columns;
a spare block of memory cells having the same number of cells as said normal block arranged in rows and columns;
a normal column line connected to said normal block;
a spare column line connected to said spare block;
latch means including a fuse connectable to receive a supply voltage and a second input terminal connectable to a clock providing a pulse after the input of a row address strobe but before the input of column address signals, for providing a first logic signal in response to the input of said supply voltage via said fuse and a second logic signal in response to said pulse after said fuse has been blown;
spare column decoding means connected to said latch means and said spare column line, for providing a spare block disabling signal with the input of said first logic signal, and for providing a spare block enabling signal with said second logic signal and the output of true and complement column address signals, and
normal column decoding means connected to said normal column line and said spare column decoding means, for accessing said normal block via said normal column line with the input of column address signals under the control of said spare block disabling signal, and preventing accessing of said normal block with input of said spare block enabling signal.

23. A semiconductor memory comprising:
a latch including a first fuse connectable to receive a supply voltage and a second input terminal connectable to a clock providing a pulse after the input of a row address strobe but before the input of column address signals, a clamping node connected to said first fuse, an output node, a reference potential node, a first transistor having a channel path connected between said clamping node and said reference potential node and having a gate electrode connected to said second input terminal, a first inverter connected between said clamping node and said output node, a second transistor having a channel path connected between said clamping node and said reference potential node and a gate electrode connected to said output terminal, and providing a first logic signal at said output node in response to the input of said supply voltage via said fuse and a second logic signal at said output node in response to said pulse after said fuse has been blown;

spare column decoding means connected to said output node, for providing a spare block disabling signal in response to reception of said first logic signal, and for providing a spare block enabling signal in response to reception of said second logic signal and true and complement column address signals; and normal column decoding means connected to said normal column lines and said spare column decoding means, for accessing a normal block of memory cells via a corresponding normal column lines in response to reception of column address signals under control of said spare block disabling signal, and preventing accessing of a normal block of memory cells in response to reception of said spare block enabling signal.

24. A semiconductor memory according to claim 23, wherein said first and second transistors are N-channel MOS transistors and said first inverter is a CMOS inverter.

25. A semiconductor memory according to claim 23, wherein said spare column decoding means comprises:

a plurality of true and complement column address input terminals conducting true and complement column address signals of each column address signal;

a plurality of true and complement transmitting paths connected to said true and complement column address input terminals respectively;

a plurality of transmission means each associated in series on different ones of said transmitting paths respectively, for transmitting true and/or complement column address signals in response to said second logic signal of said latch;

a plurality of second fuses each associated in series on different ones of said transmitting paths respectively;

a plurality of connecting nodes commonly connected at end terminals of said true and complement transmitting paths;

a plurality of transistors having channel paths connected in parallel between said connecting nodes and said reference potential node and gate electrodes coupled to receive complements of said output logic signal of said latch means; and a logic gate connected to said connecting nodes.

26. A semiconductor memory according to claim 25, wherein said transmission means comprises a pair of P-channel MOS and N-channel MOS transistors having channel paths connected in parallel, a gate of said P-channel MOS transistor coupled to receive complements of said output logic signal of said latch and a gate of said N-channel MOS transistor coupled to receive said output logic signals of said latch.

27. A semiconductor memory according to claim 26, wherein said logic gate is NAND gate and each of said transmitting paths is arranged to transmit true column address signals.

28. A semiconductor memory, comprising:

latch means including a first fuse connectable to receive a supply voltage and a second input terminal connectable to a clock providing a pulse after the input of a row address strobe but before the input of column address signals, for providing a first logic signal in response to the input of said supply voltage via said first fuse and a second logic signal in response to said pulse after said first fuse has been blown;

a spare column decoder connected to said latch means, and including:

a plurality of true and complement column address input terminals conducting true and complement column address signals of each column address signal;

a plurality of true and complement transmitting paths connected to said true and complement column address input terminals respectively;

a plurality of transmission means each associated in series on different ones of said transmitting paths respectively, for transmitting true and/or complement column address signals in response to reception of said second logic signal of said latch means;

a plurality of second fuses each associated in series on different ones of said transmitting paths respectively;

a plurality of connecting nodes commonly connected at end terminals of said true and complement transmitting paths of each column address signal;

a plurality of transistors having channel paths connected in parallel between said connecting nodes and a reference potential node and having gate electrodes coupled to complements of said output logic signal of said latch means; and logic means connected between said connecting nodes and a spare column line, for providing a spare block disabling signal upon input of said first logic signal, and for providing a spare block enabling signal upon input of said second logic signal and true and complement column address signals; and normal column decoding means connected to said spare column decoding means, for accessing a normal block of memory cells via a normal column line in response to reception of column address signals under the control of said spare block disabling signal, and preventing accessing of said normal block of memory cells in response to reception of said spare block enabling signal.

29. A dynamic random access memory according to claim 28, wherein said logic means is a NAND gate and each of said transmitting paths is arranged to transmit true column address signals.

* * * * *